US006711388B1

(12) United States Patent
Neitiniemi

(10) Patent No.: US 6,711,388 B1
(45) Date of Patent: Mar. 23, 2004

(54) DISTRIBUTED POWER LEVEL CONTROL SYSTEM OF TRANSMITTER FOR CELLULAR COMMUNICATION

(75) Inventor: Jukka-Pekka Neitiniemi, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/539,241

(22) Filed: Mar. 30, 2000

(51) Int. Cl.[7] .............................................. H01Q 11/12
(52) U.S. Cl. ..................... 455/127.1; 455/571; 455/522; 455/561
(58) Field of Search ................................. 455/127, 567, 455/126, 571, 550, 561, 73, 129, 137, 138, 522, 127.1, 550.1

(56) References Cited

U.S. PATENT DOCUMENTS

| | | | | |
|---|---|---|---|---|
| 5,303,395 A | * | 4/1994 | Dayani ..................... 455/571 |
| 5,710,991 A | * | 1/1998 | Lee ............................ 455/126 |
| 5,805,986 A | * | 9/1998 | Mizusawa et al. .......... 455/126 |
| 5,854,972 A | * | 12/1998 | Pennock et al. ............ 455/126 |
| 5,867,060 A | * | 2/1999 | Burkett, Jr. et al. ............ 330/2 |
| 6,337,975 B1 | * | 1/2002 | Coan et al. ................. 455/129 |
| 6,449,467 B1 | * | 9/2002 | Kingswood et al. ......... 455/127 |

* cited by examiner

Primary Examiner—Sonny Trinh
(74) Attorney, Agent, or Firm—Brown Raysman Millstein Felder Steiner

(57) ABSTRACT

A transmitter circuit and method for transmitting a data signal at a desired transmitter power level. The transmitter circuit includes an attenuator for attenuating the data signal by an attenuation factor. An external amplifier receives the attenuated signal and amplifies the signal to an amplified signal voltage. A storage unit containing a set of calibrated power levels associated to a set of amplifier voltages provides a calibrated power level based on the amplified signal voltage. A controller is configured to modify the attenuation factor of the attenuator in response to the difference between the calibrated power level and the desired transmitter power level.

9 Claims, 7 Drawing Sheets

DISTRIBUTED POWER LEVEL CONTROL SYSTEM OF TRANSMITTER FOR CELLULAR COMMUNICATION

BACKGROUND OF THE INVENTION

1. Fields of the Invention

The present invention relates to cellular communication, and more specifically to an output power control system for a cellular base station.

2. Relevant Background

A cellular communication system divides a geographic region into several smaller-sized service areas called "cells". Typically, each cell includes a base station which communicates with a number of mobile stations within the cell. A conventional base station generally includes an external amplifier which boosts an input signal to an appropriate power level for transmission. The boosted signal from the external amplifier is then passed to an antenna via a cable and transmitted to the mobile stations.

An important aspect of cellular communication is the amount of radio interference between closely located base stations. Radio interference is typically caused by two or more broadcasting stations simultaneously transmitting radio signals which overlap in both frequency and geography. For example, if two television stations broadcast the same channel frequency in the same city, each station signal will interfere with the other, resulting in information loss due to the clashing signals. Radio interference between base stations is therefore undesirable during wireless communication.

Minimizing interference between radio stations operating at the same carrier frequency range requires controlling the geographic service area covered by each station such that there is minimal overlap between service areas. A station's service area is generally proportional to the power of its transmitted signal, with the territorial coverage increasing as transmission power is increased. By decreasing the transmission power, less area is covered by the transmitting station.

As previously mentioned, a cellular system utilizes cells to achieve radio communication. Ideally, each cell's effective service area boundary just touches a neighboring cell's boundary, thereby forming a grid pattern over the entire region of the cellular network. In order to minimize interference between adjoining cells, each base station's transmission power must be decreased to cover an area no greater than the cell's allocated service area. Decreasing the power of transmitted radio signals too much, however, can be problematic. Typically, if the power level of transmitted radio signals is too low, poor signal to noise ratios at the receiving end result. This can often lead to insufficient cell coverage or a received signal which contains static and/or errors. Therefore, the ability to precisely control base station transmission power is vital to a cellular communication system.

In addition to minimizing interference between base stations, transmission power levels are also adjusted as cellular traffic in a cell changes. Typically, each base station can service up to a certain maximum number of mobile stations at any given time. Once a base station reaches its maximum capacity, the introduction of additional mobile stations requiring service by the base station often leads to blocked calls, dropped calls, and a general feeling of hostility towards the cellular service provider by its customers.

To prevent such undesirable consequences from occurring, base station transmission power is often adjusted to accommodate high cellular traffic areas. Such adjustments may help shift a base station's service area from a region of high cellular traffic to a region of lower cellular traffic. Furthermore, power adjustments to existing base stations are often necessary when new base stations are constructed to meet the changing traffic demands of a cellular system.

In addition to meeting the changing traffic demands of cellular systems, precise control of base station transmission power levels is also important in meeting the changing demands of government agencies. Cellular radio communication is typically government regulated for various frequency bands and geographic areas. Government regulations often include a maximum allowable transmission power level which base stations must not exceed. It is therefore necessary to accurately check and control power levels of base station transmitted signals in order to comply with government regulations.

Although a base station's transmission power level is an important specification in cellular communication systems, accurately adjusting transmission power is often difficult to perform. Component non-linearity typically requires trial and error procedures when tuning a base station to an appropriate power transmission level. In addition, parameter variations of base station components during manufacturing typically prevent identical base station adjustments from yielding the same power transmission levels from one base station to another.

Other difficulties may further develop once base stations are installed at their intended site location. After a base station is moved to its permanent location, field equipment is generally necessary to adjust base station transmission power levels. Typically, field equipment is less accurate and more prone to calibration errors due to travel wear and tear than stationary test equipment used during production. In addition, it is often difficult and expensive to carry field equipment to remote site locations, such as a mountain peak. Moreover, adjusting transmission power levels of active base sites may also require interruption of service during testing. It is therefore important to accurately perform transmission power level adjustments as quickly as possible in some cases.

What is therefore needed is a base station design which allows transmission power levels to be adjusted quickly and accurately. The design should take into account component non-linearities and parameter variations. The design should also allow for power level adjustments without requiring the transport of field test equipment.

SUMMARY OF THE INVENTION

Briefly stated, the present invention involves a transmitter circuit for accurately amplifying a data signal to a desired power level. The transmitter circuit includes a variable attenuator coupled to the data signal such that the data signal is attenuated by an attenuation factor proportional to a reference signal. The transmitter circuit further includes an external amplifier coupled to the variable attenuator for amplifying the data signal to an external amplifier power level. The external amplifier includes a forward power detector and a calibration table. The forward power detector provides a forward power signal to the calibration table. The calibration table associates the forward power signal to the external amplifier power level. A controller configured to receive the external amplifier power level from the calibration table modifies the reference signal in response to a difference between the amplifier power level and the desired power level.

Another aspect of the invention is a method for transmitting a data signal at a desired power level for a radio transmitter. The method includes storing a group of calibrated power level values in a power lookup table, measuring an amplified voltage level of the data signal, providing a calibrated power level selected from the group of calibrated power level values based on the amplified voltage level, using the difference between the calibrated power level and the desired power level to generate an attenuation control value, and attenuating the data amplitude according to the attenuation control value.

DETAINED DESCRIPTION OF THE INVENTION

Figure 1:
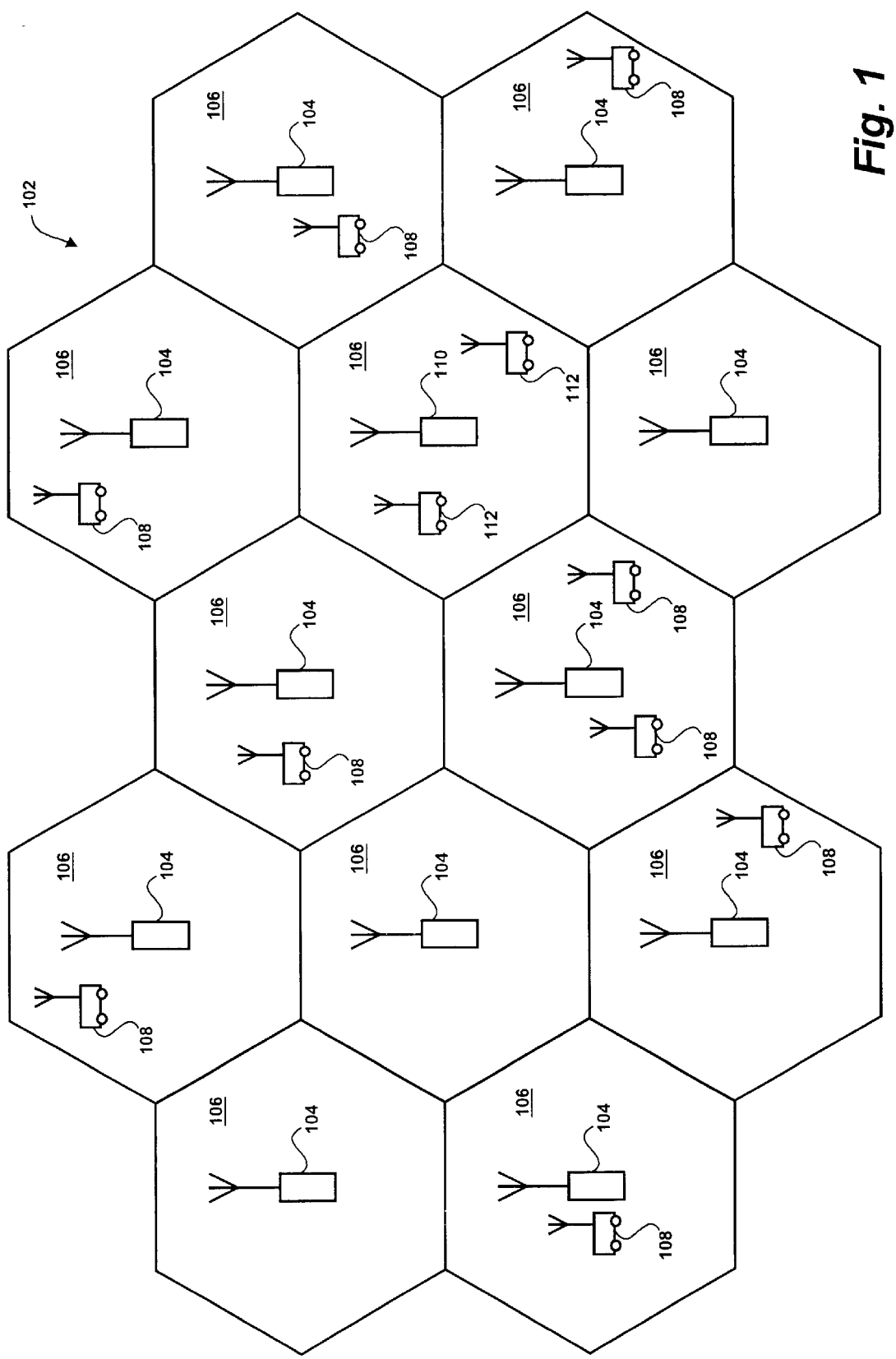
FIG. 1 shows a portion of an exemplary wireless cellular communication system as contemplated by the present invention.

Referring first to FIG. 1, a portion of an exemplary wireless cellular communication system 102 as contemplated by the present invention is shown. The system 102 includes a number of base stations 104 spaced throughout a geographical area, with each base station defining a cell 106. The cells 106 collectively cover the area encompassed by the cellular communication system 102. Each base station 104 communicates with mobile stations 108 located within its cell 106 by transmitting and receiving radio signals to and from the mobile stations 108. Thus, base station 110 communicates with cellular stations 112.

It is also possible to implement the present invention using other conventional cellular system configurations. For example, each cell may be divided into several sectors such that more than one base station is used to communicate in a given cell. Furthermore, a base station may be configured to span over several adjoining cell sectors located in different cells such that each base station is shared with more than one cell region.

The area encompassed by each cell 106 is proportional to the power level of transmitted signals originating from the each cell's respective base station 104. As described more fully below, the present invention allows base stations 104 to quickly and accurately adjust the power level of their transmitted radio signals to the mobile stations. This helps minimize radio interference between adjoining cells, improve signal to noise ratios, and ensure compliance with government radio transmission regulations.

Figure 2:
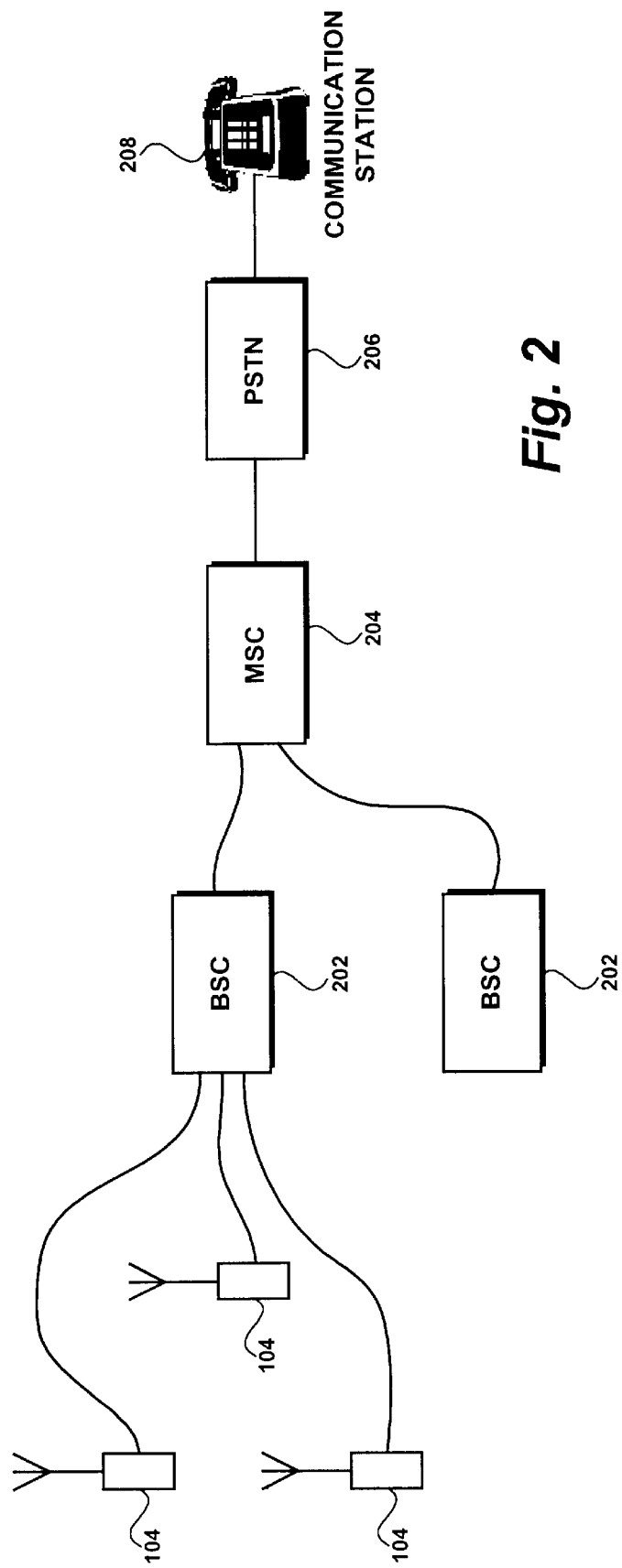
FIG. 2 further details the implementation of a cellular communication system of the present invention.

In FIG. 2, the implementation of the present invention is further detailed. Groups of base stations 104 are coupled to a base station controller (BSC) 202. A BSC 202 is operable to control radio base stations coupled thereto. Groups of BSCs 202 are coupled, in turn, to a mobile switching center (MSC) 204. A MSC 204 performs switching operations and is coupled to a public-switched telephone network (PSTN) 206. The PSTN is coupled to communication stations, such as the communication station 208, here a conventional wire-line telephone. Telephonic communication is effectuated between, for instance, the mobile station 108 (see FIG. 1) and the communication station 208 by way of the PSTN 206 and the network infrastructure including the MSC 204, the BSC 202, and the radio base station 104 to which the mobile station 108 is proximate by way of a radio link formed between the mobile station 108 and the radio base station 104.

Figure 3:
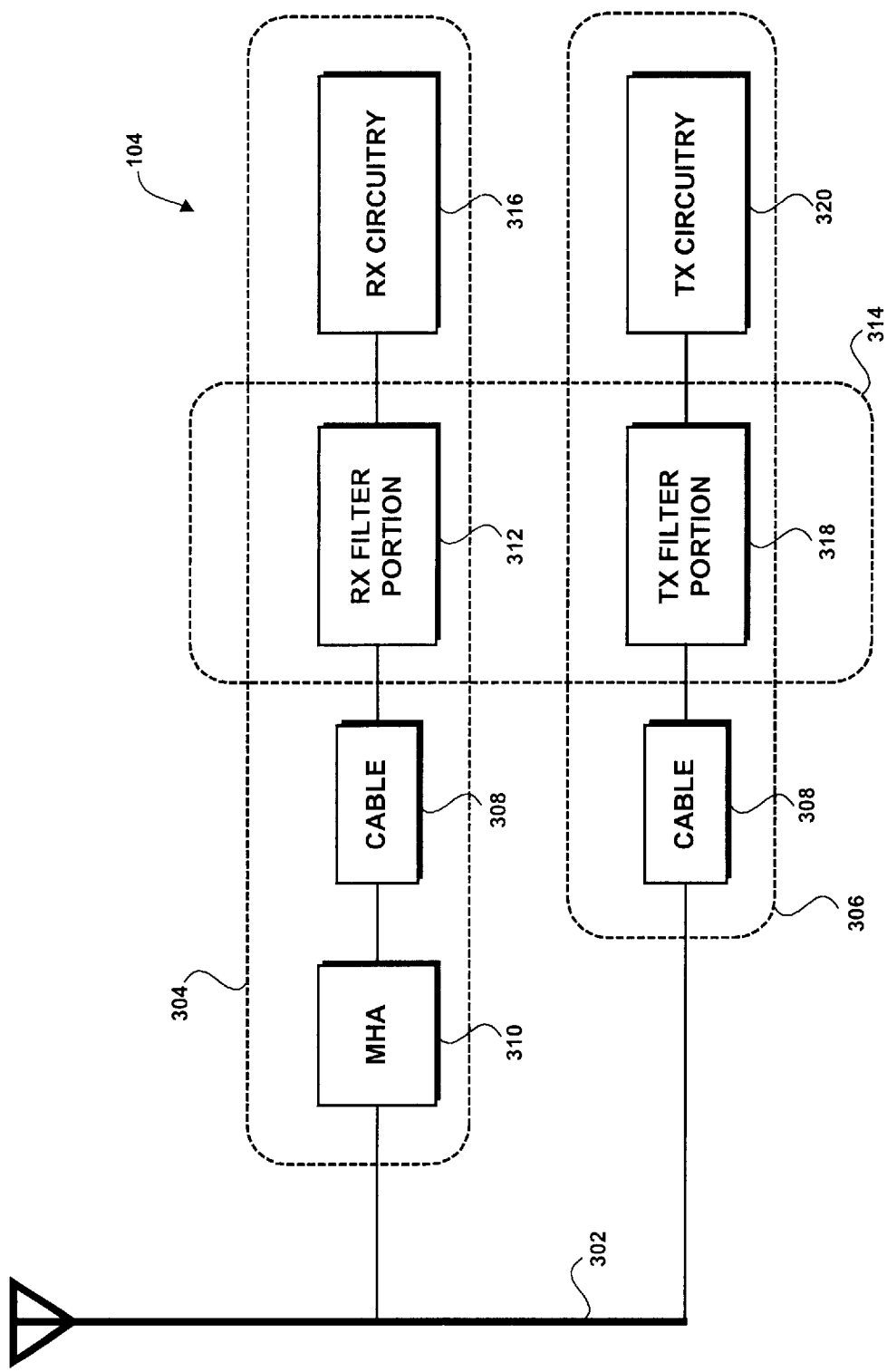
FIG. 3 illustrates an exemplary radio base station which includes an embodiment of the present invention.

FIG. 3 illustrates an exemplary radio base station 104 which forms a portion of the network infrastructure of the cellular communication system shown in FIG. 2. The radio base station 104 includes an embodiment of the present invention as a portion thereof. The base station 104 comprises a mast head 302 operable to transduce reverse link signals (signals from the mobile station to the base station) received into electrical form, and also to transduce forward link signals (signals from the base station to the mobile station) for transmission into electromagnetic form.

The base station 104 includes both a transmitter portion 304 and a receiver portion 306 to permit transceiving of both forward-link and reverse-link signals respectively. To facilitate communications, the mast head 304 is typically positioned at an elevated location, often separate from other portions of the radio base station. The mast head 304 is therefore oftentimes coupled to the transmitter and receiver portions 304 and 306 of the base station by way of a cable 308.

The base station 104 includes a mast head amplifier (MHA) 310 positioned in-line between the mast head 302 and the cable 308 extending to the receiver portion 304. The MHA amplification level may be of a constant amplitude level or of a selectable gain level. Thereby, when a received signal is provided to the receiver portion 304 of the base station 104, the signal is of an amplified signal level.

As further illustrated in FIG. 3, the cable 308 is coupled to a receive filter portion 312 of a filter duplexer 314. The receive filer portion 312 exhibits a filter pass band of a selected bandwidth for passing received signals within such pass band and for rejecting signals outside such pass band. Received signals are passed by the receiver filter portion 314 to other portions of the receiver circuitry 316 of the base station 104.

The radio base station is further shown to include transmitter circuitry 320 operable to generate transmit signals which are applied to a transmit filter portion 318 of the filter duplexer 314. The transmit filter portion 318 exhibits a filter pass band of a selected bandwidth for passing transmitted signals within such pass band and for rejecting signals outside such pass band. After the signals pass the transmit filter portion 318, they are conducted through the cable 308 and transduced by the mast head 302 into radio signals.

Figure 4:
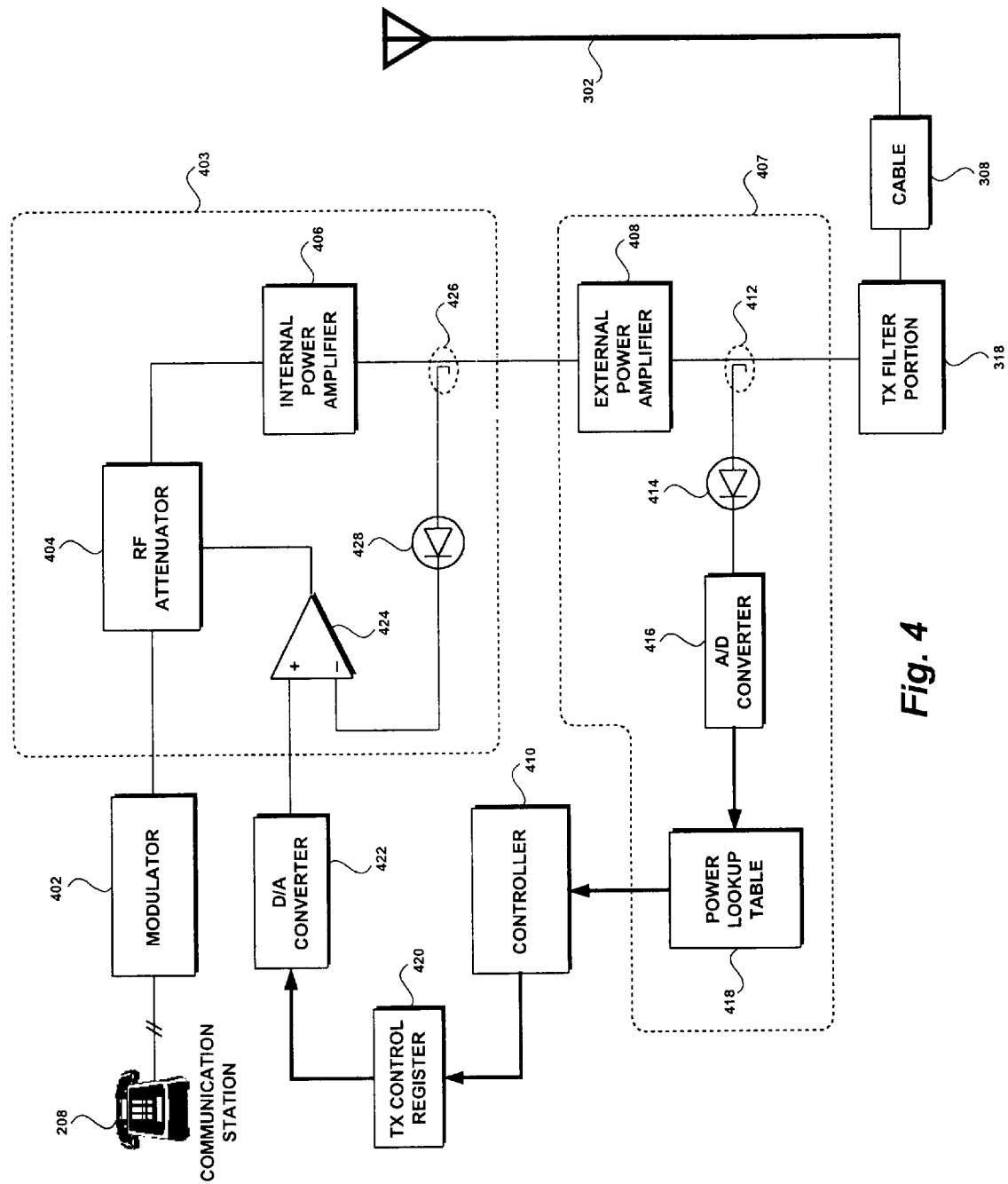
FIG. 4 shows a more detailed view of the transmitter circuitry as contemplated by the present invention.

FIG. 4 shows a more detailed view of the transmitter circuitry as contemplated by the present invention. A modulator 402 receives source data from the communication station 208 and modulates the data to a higher carrier frequency. Typically, the carrier frequency is the radio frequency at which the source data is transmitted to mobile stations. The modulator 402 may include a number of up converters (not shown), with each up converter shifting the source data to a higher frequency.

Once the data is modulated, it is passed through a radio frequency (RF) variable attenuator 404. The attenuator 404 decreases the amplitude of the modulated data signal and passes the resulting signal to an internal amplifier 406. By attenuating the signal's amplitude, the power level of the later transmitted signal can be controlled. The amount of attenuation is determined by an attenuation factor input to the attenuator 404. In a preferred embodiment of the present invention, signal attenuation is linearly proportional to the attenuation factor, however, it is contemplated that the attenuation factor may have a different algebraic relationship with the resulting amplitude, such as a logarithmic relationship.

After the signal passes the attenuator 404, it is amplified by the internal power amplifier 406 and then by an external power amplifier 408. The internal power amplifier 406 is typically a low power amplifier used to drive the signal to the external power amplifier 408. The external power amplifier 408 is used to boost the signal to a power level suitable for transmission as radio waves. In a preferred embodiment, gain levels of both the internal power amplifier 406 and the external power amplifier 408 are of constant levels, however, other embodiments detailed below may vary the gain levels of the internal power amplifier 406 and the external power amplifier 408. It should be noted that both the internal power amplifier 406 and the external power amplifier 408 may include multiple amplifier stages configured in a chain.

Once amplified, the signal is then passed through the transmitter filter 318 and the cable 308 to the mast head 302, where the signal is transduced into electromagnetic radio waves, allowing wireless transmission of the signal.

According to the invention, the power level of transmitted signals originating from the communication station 208 is controlled by the attenuator 404. Since the internal power amplifier 406 and the external power amplifier 408 are set to constant amplification gain, the transmission power level is inversely proportional to the attenuation factor. That is, as the attenuation factor of the source signal is increased, the transmission power level of the signal is decreased. It is contemplated, however, that other embodiments of the present invention may control the transmitted power level by means of the internal power amplifier 406 or the external power amplifier 408, either alone or in combination. For example, the transmitter power level may be varied by adjusting the amplification level of the internal power amplifier 406 instead of the attenuation factor of the attenuator 404.

The attenuation factor is set by a comparator 424. The comparator 424 subtracts a detected signal from a reference signal, and passes the result as the attenuation factor to the RF attenuator 404. The reference signal is determined by a controller 410 monitoring the power level of the external power amplifier 408. The controller 410, which may be a microprocessor or other state machine, adjusts the reference signal according to a difference between the power level of the external power amplifier 408 and a desired power level. For example, if the power level of the external power amplifier is too high, the controller 410 can increment the reference signal until the power level is at the desired level. The controller 410 changes the reference signal by updating a binary control value stored in a transmitter control register 420. The control value is read by a digital-to-analog (D/A) converter 422 and is converted to the analog reference signal.

The detected signal subtracted from the reference signal by the comparator 424 is generated using a RF coupler 426 and a power detector 428 connected in series to the internal power amplifier output. In this manner, an analog power control loop 403 is created wherein the amplified data signal from the internal power amplifier 406 is modulated by the RF attenuator 404 to track the reference signal issued by the controller 410.

Figure 5:
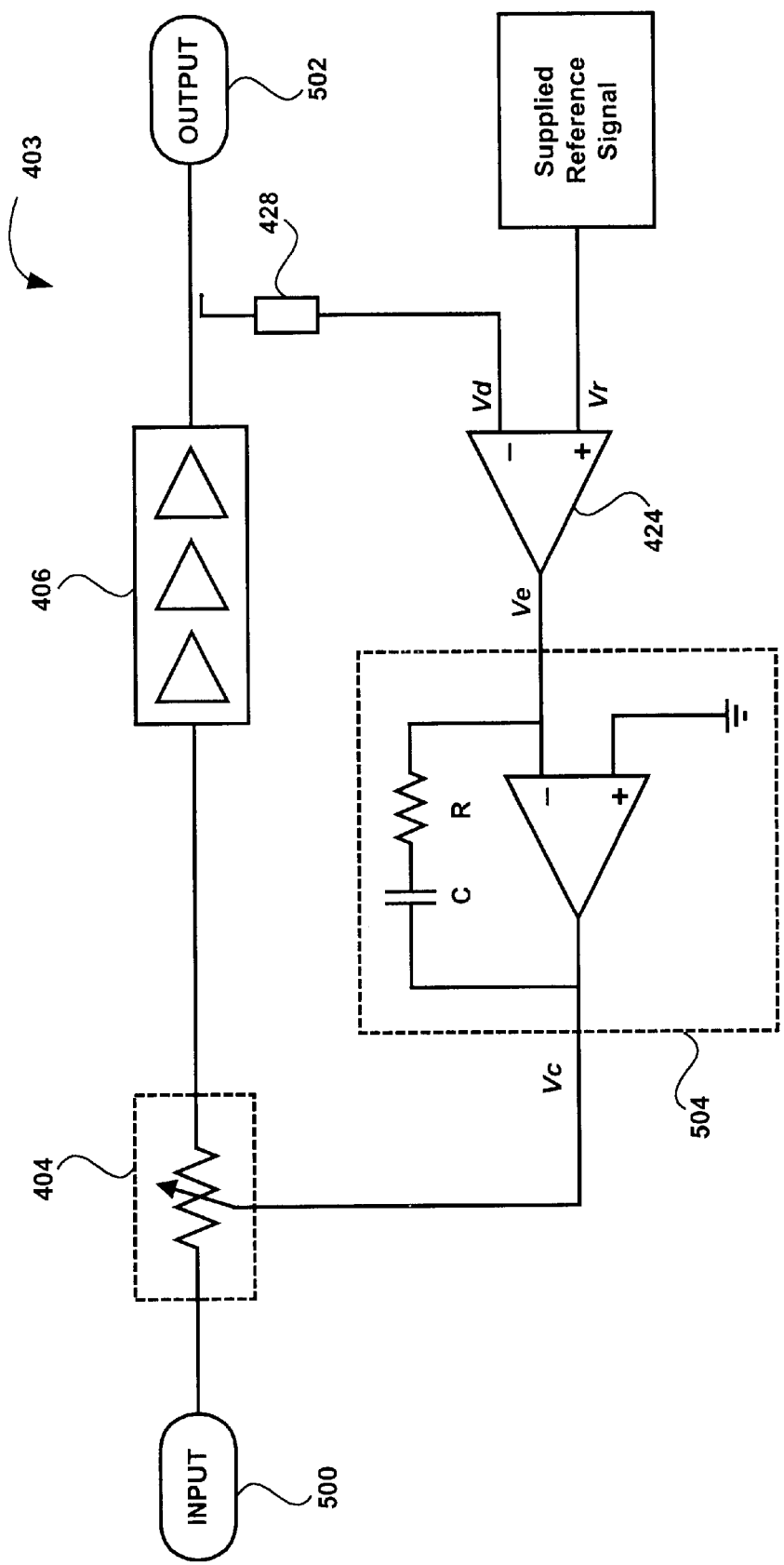
FIG. 5 shows a schematic view of an analog power control loop used to control the transmitter power.

FIG. 5 shows another schematic view of the analog power control loop 403 used to control the transmitter power. The variable attenuator 404 is coupled to the input of the internal power amplifier 406 (shown in FIG. 5 as an amplifier chain), such that the variable attenuator 404 and internal power amplifier 406 are disposed between the input 500 and output 502 of the analog power control loop 403. A control signal Vc is applied to the variable attenuator 404 to control the attenuation characteristics of the variable attenuator 404. The power detector 428 is coupled to the output of the internal power amplifier 406. A portion of the output signal is detected by the power detector 428 and is converted to a detected signal Vd, and Vd is input to the comparator 424. Vd is compared against a supplied reference signal Vr from the controller 410, with Vr proportional to the desired output. Vr is compared to Vd and the difference, an error signal Ve, is integrated by an integrator 504 to provide the control signal Vc to the variable attenuator 404.

Referring back to FIG. 4, a forward power detector 414 coupled to the external power amplifier output by a RF coupler 412 is used to provide the controller 410 with the power level of the external power amplifier 408. The output of the forward power detector 414 is passed to an analog-to-digital (A/D) converter 416. The A/D converter 416 outputs a binary representation of the analog voltage present at its input. Typically, the accuracy of the A/D converter 416 is dependent on its bit-length output. In an exemplary embodiment of the present invention, the A/D converter 416 represents the analog input voltage as a 10-bit word. It is contemplated, however, that other A/D converters of greater or lesser length bits may be used depending on the precision demanded by the communication system.

Once the forward voltage level from the forward power detector 414 is converted to binary form by the A/D converter 416, the binary value is passed to a power level lookup table 418. The power level lookup table 418 contains calibrated power levels which are indexed by the binary forward voltage value. Thus, each binary forward voltage value is associated to an external amplifier power level.

Table 1 contains an exemplary representation of the power level lookup table 418. As shown, the lookup table includes a detected forward voltage field and an associated external amplifier power level field. The detected forward voltage field holds a voltage level reading from the A/D converter 416 made during an earlier calibration measurement. The external amplifier power level field contains the measured transmission power of the transmitter as reported by measurement equipment (not shown) at the time the A/D converter 416 reading is recorded. In one embodiment of the present invention, the measurement equipment can be configured to communicate with the controller 410 such that transmitter power measurements are triggered and stored by the controller 410.

TABLE 1

Sample power lookup table values

| Detected Forward Voltage (mV) | External Amplifier Power Level (mW) |
|---|---|
| 4462 | 39811 |
| 2815 | 15849 |
| 1776 | 6310 |
| 1121 | 2512 |
| 707 | 1000 |
| 446 | 398 |
| 282 | 158 |
| 178 | 63 |
| 112 | 25 |
| 71 | 10 |

The external power amplifier 408, RF coupler 412, forward power detector 414, A/D converter 416, and power level lookup table 418 comprise an external amplifier 407. Preferably, the power lookup table 418 is embodied in non-volatile memory, such as ROM, Flash memory, magnetic media, or other storage technologies known in the art. Furthermore, it is contemplated that entries to the power lookup table 418 are recorded at the time the external amplifier 407 is manufactured. Essentially, this involves an initialization routine wherein the external amplifier 407 is configured to step through a range of output power levels of the external power amplifier 408. Table entries are then created by recording an output power level and a corresponding A/D converter output in the power lookup table 418. Measuring and recording a broad range of amplifier power levels during the manufacturing stage is advantageous in that future power adjustments do not require transporting field equipment to the base station's final site location. Moreover, future power adjustments can be performed quickly, thereby minimizing any off-line service time due to transmitter output power modification.

Figure 6:
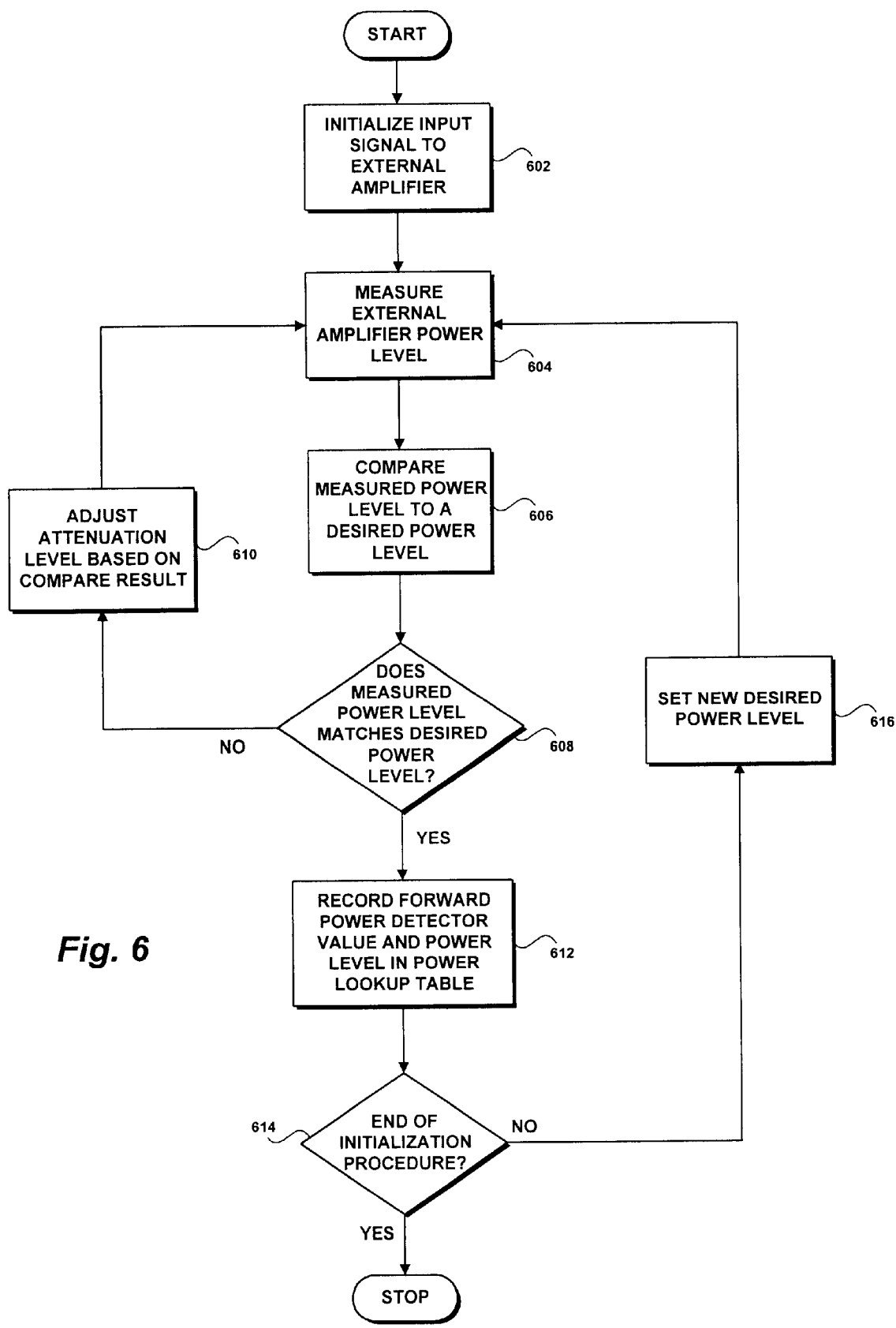
FIG. 6 shows a flowchart representation of an initialization routine to record entries in a power lookup table.

FIG. 6 shows a flowchart representation of an initialization routine to record power lookup table entries. At step 602, an initial external amplifier input signal is set. It is contemplated that the initial input signal is set equal to zero volts, however other values may be used. In addition, the input signal may be generated utilizing the analog power control loop 403 circuit, or a separate automated test bench setup during external amplifier 407 production. At step 604, the power level of the external power amplifier 408 is measured using production measurement equipment. Next, the measured power level is compared to a desired power level at step 606. At step 608, a decision block transfers control to either step 610 or step 612 depending on whether the measured power level matches the desired power level. If the measured power level is not equal to the desired power level, the external amplifier input signal is adjusted (either incremented or decremented) such that the measured power level eventually equals the desired power level at step 610. Once the measured power level matches the desired power level, the forward voltage level from the A/D converter 416 and the measured power level are recorded as an entry in the power lookup table 418 at step 612. At step 614, the routine checks if more entries to the power lookup table 418 are needed. If more entries are needed, a new desired power level is set at step 616, and the above process is repeated. If no more entries are needed, the lookup table initialization process has completed and the program ends.

Returning again to FIG. 4, the controller 410 compares the current transmission power level to a desired transmission power level and, depending on this comparison, adjusts transmitter power level accordingly. As earlier described, the controller 410 changes the transmitter power level by updating a binary control value stored in the transmitter control register 420. The power level control value is read by the digital-to-analog (D/A) converter 422 and is converted to an analog reference signal. The comparator 424 subtracts a detected signal from the internal amplifier output and passes the result as the attenuation factor to the RF attenuator 404.

Figure 7:
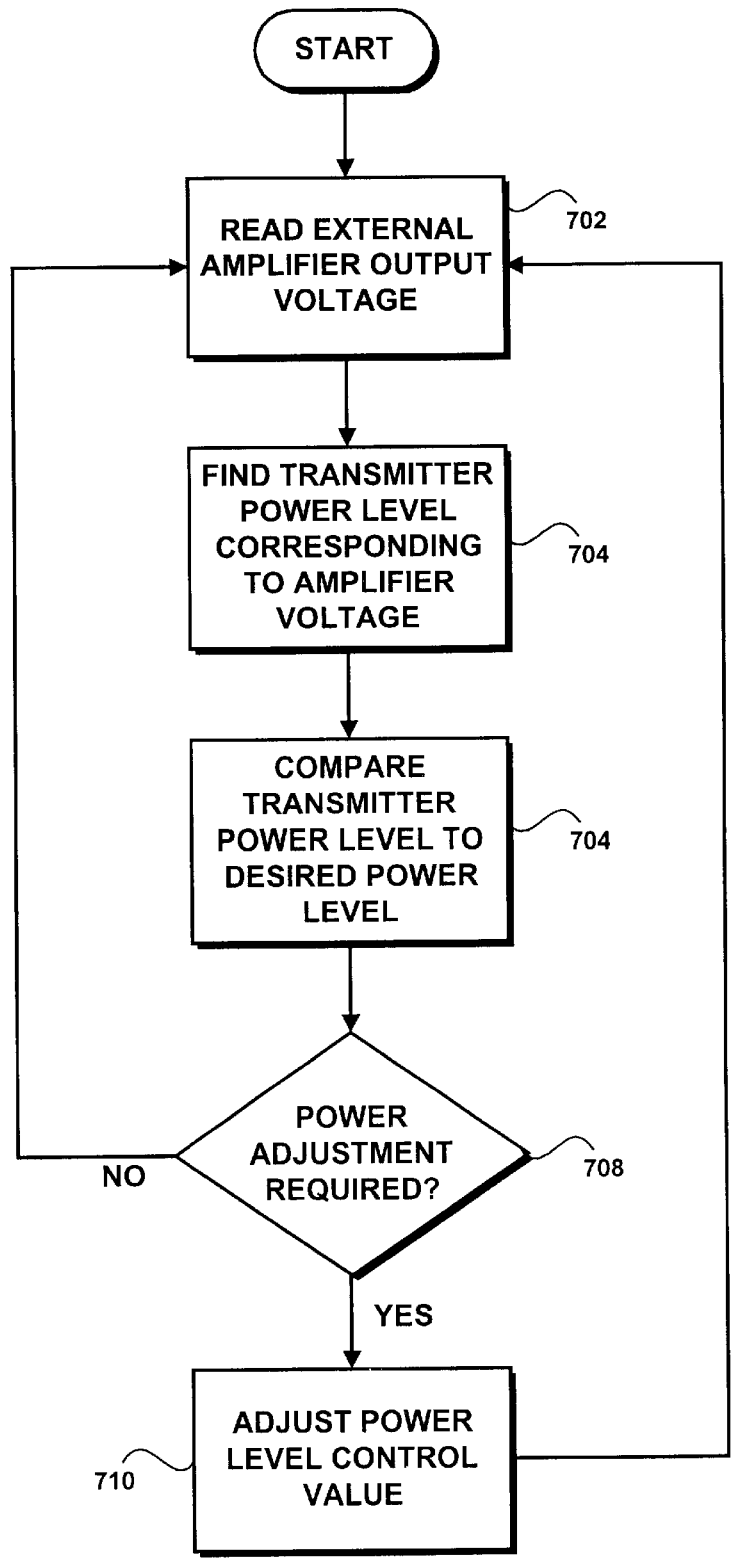
FIG. 7 shows a flowchart representation of a program loop which monitors the transmitter power level.

During operation, the controller 410 contains a program loop which monitors the transmitter power level as shown in FIG. 7. At step 702, the controller 410 reads an external amplifier voltage from the A/D converter 416. At step 704, the external amplifier voltage is used to index the transmitter power level contained in the power lookup table 418. At step 706, a comparison is then made by the controller 410 between the transmitter power level to a desired transmitter power level. If the difference between the two values is greater than a threshold value, the controller adjusts the power level control value stored in the transmitter control register 420, at steps 708 and 710. If no power level adjustments are necessary, or after adjustments are made, the program loops back to step 702.

The desired transmitter power level is generally set by the base station operator either locally or remotely. For example, the base station may be configured with a keypad or other input device which allows an operator to enter a new transmitter power level. To update the transmitter power level remotely, a new power level can be sent to the controller 410 using a frequency channel reserved for base station control information.

Although the invention has been described and illustrated with a certain degree of particularity, the invention can also be employed to control other wireless transmitter systems having an external power amplifier. One such system can be a mobile station 108 (see FIG. 1) wherein the mobile station's transmitter power needs to be controlled. It is therefore understood that the present disclosure has been made only by way of example, and that numerous changes, combinations and arrangements of techniques can be resorted to by those skilled in the art without departing from the spirit and scope of the invention, as hereinafter claimed.

The invention claimed is:

1. A transmitter circuit for accurately amplifying a data signal to a desired power level, the transmitter circuit comprising:

a variable attenuator coupled to the data signal such that the data signal is attenuated by an attenuation factor proportional to a reference signal;

an external amplifier coupled to the variable attenuator for amplifying the data signal to an external amplifier power level, the external amplifier including a forward power detector and a calibration table, the forward power detector providing a forward power signal to the calibration table, and the calibration table associating the forward power signal to the external amplifier power level;

a controller configured to receive the external amplifier power level from the calibration table, wherein the controller modifies the reference signal in response to a difference between the amplifier power level and the desired power level; and a control register coupled to the controller, the control register storing a binary reference signal value convertible via a digital-to-analog converter to the reference signal.

2. The transmitter circuit of claim 1 further comprising:

an internal amplifier coupled in series circuit between the attenuator and the external amplifier, the internal amplifier amplifying the data signal to an internal amplifier power level;

an internal amplifier power detector providing a detected signal proportional to the internal amplifier power level; and a comparator configured to modify the attenuation factor of attenuator in response to a difference between the reference signal and the detected signal, wherein the attenuator, internal amplifier and comparator form a feedback loop.

3. The transmitter circuit of claim 2 wherein the digital to analog converter is connected in series between the control register and comparator, the digital to analog converter receiving the binary reference signal value and converting it to the reference signal.

4. The transmitter circuit of claim 1 wherein the data signal is attenuated by the attenuator in substantially linear proportion to the attenuation factor.

5. The transmitter circuit of claim 1 wherein the external amplifier includes a substantially constant gain level.

6. The transmitter circuit of claim 1 wherein the calibration table is a non-volatile storage unit.

7. A method for transmitting a data signal at a desired power level for a radio transmitter, the method comprising:

storing a group of calibrated power level values in a power lookup table;

measuring an amplified voltage level of the data signal;

providing a calibrated power level selected from the group of calibrated power level values based on the amplified voltage level;

generating an attenuation control value from a difference between the calibrated power level and the desired power level;

attenuating the data amplitude according to the attenuation control value;

measuring an attenuated voltage level of the data signal;

generating an attenuation factor responsive to a difference between the attenuation control value and the attenuated voltage level, the attenuation factor further being proportional to a reference signal; and storing a binary reference signal value convertible via a digital-to-anialog converter to the reference signal.

8. The method of claim 7 wherein the storing operation is completed during a manufacturing process of the transmitter.

9. A method for creating entries in a power lookup table calibrated for a radio transmitter, the method comprising:

setting a forward voltage level of a an input data signal to an initial voltage level;

measuring an amplified power level of the amplified data signal;

adjusting the forward voltage level of the input data signal until the measured amplified power level matches a desired power level; and storing the forward voltage level and measured amplified power level in the power lookup table such that the forward voltage level and measured amplified power level are associated together.

* * * * *